United States Patent
Lee et al.

[11] Patent Number: 6,090,675
[45] Date of Patent: Jul. 18, 2000

[54] FORMATION OF DIELECTRIC LAYER EMPLOYING HIGH OZONE:TETRAETHYL-ORTHO-SILICATE RATIOS DURING CHEMICAL VAPOR DEPOSITION

[75] Inventors: Chiarn-Lung Lee, Hsin-Chu; Han-Chung Chen, Hsin-Chu Hsien; Je Wang, Hsin-Chu, all of Taiwan

[73] Assignee: Taiwan Semiconductor Manufacturing Company, Hsin-Chu, Taiwan

[21] Appl. No.: 09/285,533

[22] Filed: Apr. 2, 1999

[51] Int. Cl.$^7$ .................................................. H01L 21/336
[52] U.S. Cl. ........................... 438/301; 438/305; 438/315
[58] Field of Search ..................................... 438/301, 305, 438/315

[56] References Cited

U.S. PATENT DOCUMENTS

| | | | |
|---|---|---|---|
| 5,354,715 | 10/1994 | Wang et al. | 437/238 |
| 5,362,526 | 11/1994 | Wang et al. | 427/573 |
| 5,599,740 | 2/1997 | Jang et al. | 437/190 |
| 5,811,343 | 9/1998 | Wann et al. | 438/305 |
| 5,812,403 | 9/1998 | Fong et al. | 364/468.28 |
| 5,855,957 | 1/1999 | Yaun | 427/255.3 |
| 5,968,587 | 10/1999 | Frankel | 427/8 |

Primary Examiner—Richard Elms
Assistant Examiner—Michael S. Lebentritt
Attorney, Agent, or Firm—George O. Saile; Stephen B. Ackerman

[57] ABSTRACT

A method for forming upon a microelectronics layer upon a substrate employed within a microelectronics fabrication a silicon oxide dielectric layer with enhanced density and reduced mobile species, ionic concentration and ionic mobility. There is provided a substrate employed within a microelectronics fabrication. There is formed upon the substrate a blanket undoped silicon oxide glass dielectric layer employing ozone assisted near atmospheric pressure thermal chemical vapor deposition (APCVD) from tetra-ethyl-ortho-silicate (TEOS) vapor, wherein a high flow rate ratio of ozone gas to TEOS vapor affords enhanced density and reduced mobile species, ionic concentration and ionic mobility in the blanket silicon oxide glass dielectric layer. There is then formed a blanket boron-phosphorus doped silicon containing glass dielectric layer over the substrate employing ozone assisted near atmospheric pressure thermal chemical vapor deposition (APCVD) to complete the dielectric layer. The blanket undoped silicon oxide glass dielectric layer serves as a barrier to diffusion of mobile species from the doped silicon containing glass dielectric layer or other dielectric layers to attenuate hot carrier injection effects, which reduces degradation of device reliability.

10 Claims, 2 Drawing Sheets

FORMATION OF DIELECTRIC LAYER EMPLOYING HIGH OZONE:TETRAETHYL-ORTHO-SILICATE RATIOS DURING CHEMICAL VAPOR DEPOSITION

BACKGROUND OF THE INVENTION

1. Field of the Invention

The invention relates to the field of dielectric layers employed within a microelectronics fabrication. More particularly, the invention relates to silicon oxide dielectric layers employed as barrier layers within microelectronics fabrications.

2. Description of the Related Art

Microelectronics fabrication are formed from microelectronics substrates upon which are formed patterned microelectronics conductor layers which are separated by microelectronics dielectric layers. As the dimensions of microelectronics fabrications have decreased. The sensitivity of electronic devices within the microelectronics fabrications to electrical charge re-arrangement due to mobile ionic charge migration becomes critical to stability of device operating parameters.

The presence of "hot carriers," i.e. energetic electrons which can be injected across potential barriers due to their excess energy and are then trapped adjacent to the interfaces between semiconductor and silicon oxide gate oxide insulator layer of a field effect transistor (FET) device, can cause drifts in the FET threshold voltage $V_t$, saturation current $I_{sat}$ and substrate leakage current $I_{sub}$ parameters. In particular, hot carrier concentrations at the semiconductor interface increase the electron-hole recombination rate, thus increasing the substrate leakage current $I_{sub}$. Such hot carrier injection effects result in degradation of device parameters after relatively short times of operation. Movement of mobile ions in the dielectric layer causes re-arrangement of the space charge therein which affects charge carriers in the semiconductor and can cause increased injection and trapping of hot electrons. The concentration of ions within the dielectric layer is controlled by reducing impurities, but problems remain with ions such a $H^+$ and $Na^+$, species which are difficult to eliminate entirely.

Silicon oxide dielectric materials are highly suited for employment as dielectric layers within microelectronics fabrications because they can be formed with high purity and generally exhibit low mobility and resistance to diffusion of most ionic species. Silicon oxide dielectric layers formed employing plasma enhanced chemical vapor deposition (PECVD) methods are found to have superior properties with respect to density, chemical purity and stability, but result in conformal layers when deposited over topographic features. In addition, the plasma exposure of the dielectric layer occurring during deposition can result in formation of electrically charged species within the dielectric layer which remain after deposition, even in the highest purity dielectric layers.

In order to obtain silicon oxide dielectric layers with more planarized surfaces for use, for example, an inter-level metal dielectric (IMD) layers, methods have been disclosed which operate at higher pressures such as ozone assisted near-atmospheric pressure chemical vapor deposition (APCVD) methods employing tetra-ethyl-ortho-silicate (TEOS) vapor. Such methods cannot employ plasma enhancement because of the high pressure of the gases involved. Thus, the silicon oxide and silicon containing glass dielectric materials formed by such methods, despite their more planar surfaces, are generally of somewhat lesser quality with respect to density, purity, stability, dielectric properties and ionic mobilities.

Methods and materials which are employed to reduce the mobility of ionic species in silicon oxide and silicon containing glass dielectric materials include doping the silicon oxide and silicon containing glass dielectric material with species such as boron and phosphorus which tend to immobilize impurity ionic species such as $H^+$ and $Na^+$ ions. However, the degree of immobilization of ionic species is highly dependent on the details of fabrication of the dielectric material, and some mobile ions may still diffuse into the vicinity of the gate oxide insulating layer where their space charge affects the semiconductor surface charge density at the gate insulator-semiconductor interface.

It is therefore towards the goals of forming upon a substrate within a microelectronics fabrication a silicon oxide dielectric layer with adequate density and reduced ionic concentration and ionic mobility to attenuate hot carrier injection and device degradation that the present invention is generally and more specifically directed.

Various methods have been disclosed for forming silicon oxide dielectric materials with superior qualities for employment in microelectronics fabrications.

For example, Wang et al., in U.S. Pat. No. 5,354,715, disclose a method for forming a silicon dioxide dielectric layer whose highly conformal nature affords improved step coverage as well as subsequent planarization over topography of surfaces of microelectronics fabrications. The method employs $O_3$ and $O_2$ gases and TEOS vapor in a plasma at relatively high pressure and low chamber temperature to form the conformal silicon dioxide layer at a high rate and low temperature, followed by an isotropic etch in the same chamber to further improve planarization.

Further, Wang et al., in U.S. Pat. No. 5,362,526, disclose a method for forming silicon dioxide dielectric layers with conformal though planarized surfaces. The method employs $O_3$ and TEOS gases in a plasma in a relatively high pressure, low temperature reactor to form silicon dioxide layers at a high rate and a subsequent isotropic etch in the same reactor to effect planarization.

Finally, Wann et al., in U.S. Pat. No. 5,811,343, disclose a method for forming a blanket silicon oxide layer over a silicon nitride layer formed upon an oxidized polysilicon layer from which fluorine has been removed by gettering into the sacrificial polysilicon oxide getter layer. The blanket silicon oxide layer passivates the silicon nitride-polysilicon layer, and it is formed employing TEOS and $O_2$ in a chemical vapor deposition (CVD) process.

Desirable in the art of microelectronics fabrication are additional methods for providing silicon oxide dielectric layers with improved quality and purity and hence reduced mobile species, ionic concentration and ionic mobility, providing FET device resistance to hot carrier injection effects and purity of silicon oxide adjacent to gate oxide insulation layer and semiconductor channel regions of FET devices.

It is towards these goals that the present invention is generally and specifically directed.

SUMMARY OF THE INVENTION

A first object of the present invention is to provide a method for forming upon a substrate employed within a microelectronics fabrication on silicon oxide dielectric layer with enhanced density and reduced mobile species, ionic concentration and ionic mobility.

A second object of the present invention is to provide a method in accord with the first object of the present invention, where there is formed a silicon oxide dielectric layer employing near-atmospheric pressure chemical vapor deposition (APCVD) from tetra-ethyl-ortho-silicate (TEOS) vapor and oxygen/ozone ($O_2/O_3$) gas mixtures.

A third object of the present invention is to provide a method in accord with the first object of the present invention and/or the second object of the present invention, where hot carrier injection effects which degrade field effect transistor (FET) device reliability are attenuated.

A fourth object of the present invention is to provide a method in accord with the first object of the present invention, the second object of the present invention and/or the third object of the present invention, where the method of the present invention is readily commercially implemented.

In accord with the objects of the present invention, there is provided a method for forming upon a substrate employed within a microelectronics fabrication a silicon oxide dielectric layer with improved physical and chemical properties. To practice the method of the present invention, there is provided a substrate employed within a microelectronics fabrication. There is formed over and upon the substrate a blanket undoped silicon oxide dielectric layer employing ozone assisted near atmospheric pressure thermal chemical vapor deposition (APCVD) from tetra-ethyl-ortho-silicate (TEOS) vapor, wherein a high flow rate ratio of ozone to TEOS affords enhanced density and reduced mobile species, ionic content and ionic mobility in the silicon oxide layer. There is then formed a blanket boron-phosphorus-doped silicon oxide dielectric layer over the substrate also employing atmospheric pressure chemical vapor deposition (APCVD) to complete the dielectric layer which contains reduced mobile species, ionic concentration and ionic mobility, and within which is an effective barrier layer to attenuate hot carrier injection which can cause degradation of device reliability.

The method of the present invention may be practiced with beneficial effect on microelectronics fabrications including but not limited to integrated circuit microelectronics fabrications, charge coupled device microelectronics fabrications, solar cell microelectronics fabrications, ceramic substrate microelectronics fabrications and flat panel display microelectronics fabrications.

The method of the present invention employs methods, materials and manufacturing equipment as are well known in the art of microelectronics fabrication, but includes ranges of operation and sequences of operations which are novel. Therefore, the method of the present invention is readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form part of this disclosure, wherein:

FIG. 1 to FIG. 3 illustrate the formation upon a substrate employed within a microelectronics fabrication of an silicon oxide dielectric layer with improved physical and chemical properties.

FIG. 4 to FIG. 6 illustrate the formation upon a semiconductor substrate employed within an integrated circuit microelectronics fabrication of a silicon oxide dielectric layer with enhanced density and reduced mobile species, ionic concentration and ionic mobility to reduce degradation of device reliability due to hot carrier injection effects.

DESCRIPTION OF THE PREFERRED EMBODIMENTS

The present invention provides a method for forming upon a substrate employed within a microelectronics fabrication a silicon oxide dielectric layer with enhanced density and reduced mobile species, ionic concentration and ionic mobility.

First Preferred Embodiment

Figure 1:
FIG. 1, FIG. 2 and FIG. 3 are directed towards a general embodiment of the present invention which represents a first preferred embodiment of the present invention.
Figure 2:
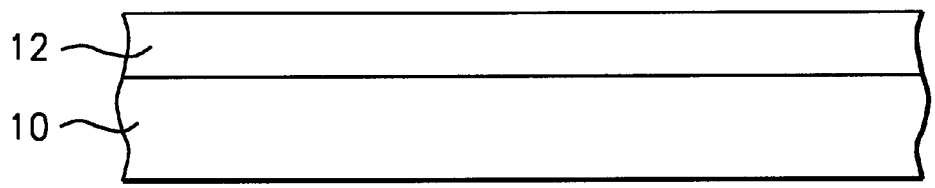
Figure 3:
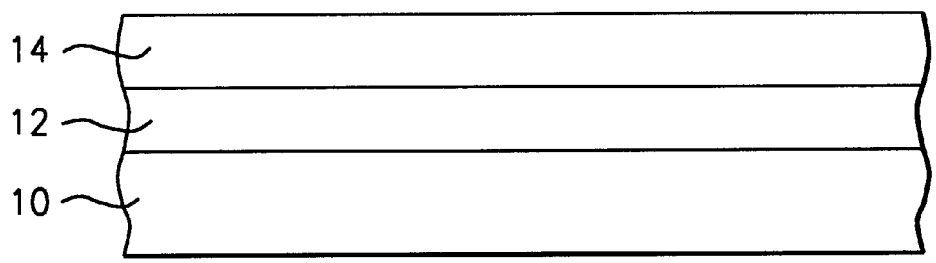

Referring now to FIG. 1 to FIG. 3, there is shown a series of schematic cross-sectional diagrams illustrating the results of forming, in accord with a general embodiment of the present invention which constitutes the first preferred embodiment of the present invention, upon a substrate employed within a microelectronics fabrication, a silicon oxide dielectric layer with enhanced density and reduced mobile species, ionic concentration and ionic mobility. Shown in FIG. 1 is a schematic cross-sectional diagram illustrating a microelectronics fabrication at an early stage in its fabrication in accord with the first preferred embodiment of the method of the present invention.

Shown in FIG. 1 is a substrate 10 employed within a microelectronics fabrication. Although not shown in FIG. 1, the substrate 10 may have formed upon it optional layers such as for example blanket dielectric layers and patterned microelectronics layers.

With respect to the substrate 10, the substrate 10 may be the substrate itself employed within a microelectronics fabrication, or alternatively the substrate 10 may be any of several microelectronics layers formed upon a substrate within the microelectronics fabrication. The substrate 10 may be a substrate employed within a microelectronics fabrication selected from the group including but not limited to integrated circuit microelectronics fabrications, charge coupled device microelectronics fabrications, solar cell microelectronics fabrications, ceramic substrate microelectronics fabrications and flat panel display microelectronics fabrications.

Referring now to FIG. 2, there is shown a schematic cross-sectional diagram illustrating the results of further processing by the method of the first embodiment of the present invention of the microelectronics fabrication whose schematic cross-sectional diagram is shown in FIG. 1. Shown in FIG. 2 is a microelectronics fabrication otherwise equivalent to the microelectronics fabrication shown in FIG. 1, but where there has been formed over the substrate, a blanket undoped silicon oxide glass dielectric layer 12.

With respect to the blanket undoped silicon oxide glass dielectric layer 12, the blanket undoped silicon oxide glass dielectric layer 12 is formed employing the method of ozone assisted near-atmospheric pressure thermal chemical vapor deposition (APCVD) using tetra-ethyl-ortho-silicate (TEOS) vapor. The blanket undoped silicon oxide glass dielectric layer 12 is preferably formed employing concentration of about 140 grams/cubic meter ($g/m^3$) $O_3$ in pure $O_2$ carrier gas flow rate of about 4000 standard cubic centimeters per minute (sccm), and providing a TEOS concentration of about 500 milligrams/cubic meter ($mg/m^3$) in a $N_2$ gas flow rate of about 850 standard cubic centimeters per minute (sccm). Preferably, the formation of the blanket undoped silicon oxide glass dielectric layer 12 is carried out at a ratio of gas flow rate of ozone to gas flow rate of TEOS of about 28 to about 1. The gas flow rate of TEOS vapor preferably is from about 900 to about 1200 standard cubic centimeters per minute (sccm). The total pressure is from about 740 to about 760 torr, and the temperature is from about 390 to about 410 degrees centigrade. The blanket undoped silicon oxide glass dielectric layer 12 is preferably formed to a thickness of about 1000 angstroms.

Referring now to FIG. 3, there is shown a schematic cross-sectional diagram illustrating the results of further processing in accord with the first preferred embodiment of the present invention of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has been formed over the substrate a blanket doped silicon containing glass dielectric layer 14.

With respect to the blanket doped silicon containing glass dielectric layer 14, the blanket doped silicon containing glass dielectric layer 14 has been formed with doping elements boron and phosphorus (B,P) employing the method of near-atmospheric pressure thermal chemical vapor deposition (APCVD) using TEOS and doping gases trimethylboron (TMB) and trimethylphosphine (TMP) in the same reactor chamber under the same conditions as were used for the blanket undoped silicon oxide glass dielectric layer 12. Preferably the blanket doped silicon containing glass dielectric layer 14 is formed employing concentrations of about 140 grams/cubic meter ($g/m^3$) cent $O_3$ in $O_2$ carrier gas at a flow rate of about 7000 to about 8000 standard cubic centimeters per minute (sccm), a TEOS concentration of about 500 milligrams/cubic meter ($mg/m^3$), a concentration of TMB of about 4.0 milligrams/cubic meter ($mg/m^3$) in a $N_2$ carrier gas flow rate of about 150 standard cubic centimeters per minute (sccm) and a concentration of TMP of about 3.0 milligrams/cubic meter ($mg/m^3$) in a $N_2$ carrier gas flow rate of about 50 standard cubic centimeters per minute (sccm). Preferably, the blanket B-P doped silicon containing glass dielectric layer 14 is formed to a thickness of about 5000 angstroms.

The blanket B-P doped silicon containing glass dielectric layer 14 serves as an effective means for reducing ionic mobility of species such as $Na^+$ or other metallic ions due to the presence of B and P dopant atoms. However, the formation of the doped silicon containing glass layer by the method employed inherently results in there being present residual H atoms which are themselves highly mobile species in silicon containing dielectric layers, and which may also constitute undesirable mobile species with respect to degradation of device reliability.

Second Preferred Embodiment

Figure 4:
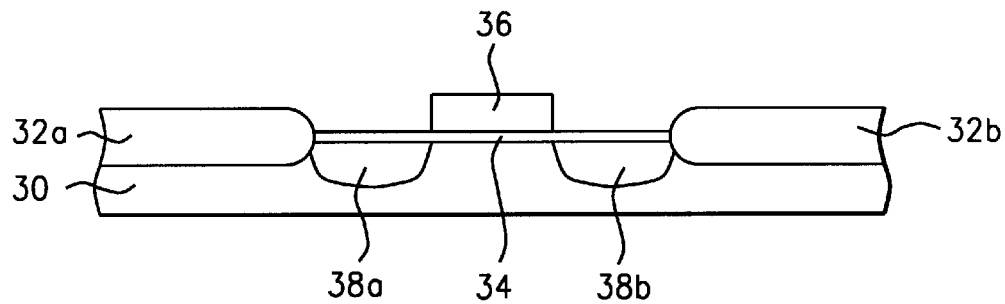
FIG. 4, FIG. 5, and FIG. 6 are directed towards a more specific embodiment of the present invention which constitutes a second preferred embodiment of the present invention.
Figure 5:
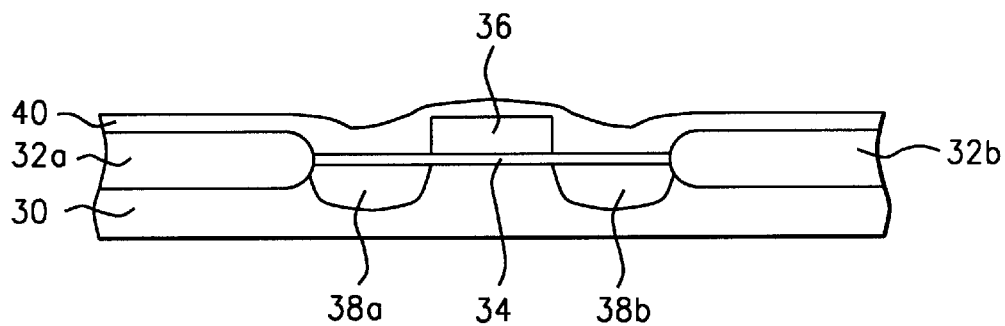
Figure 6:
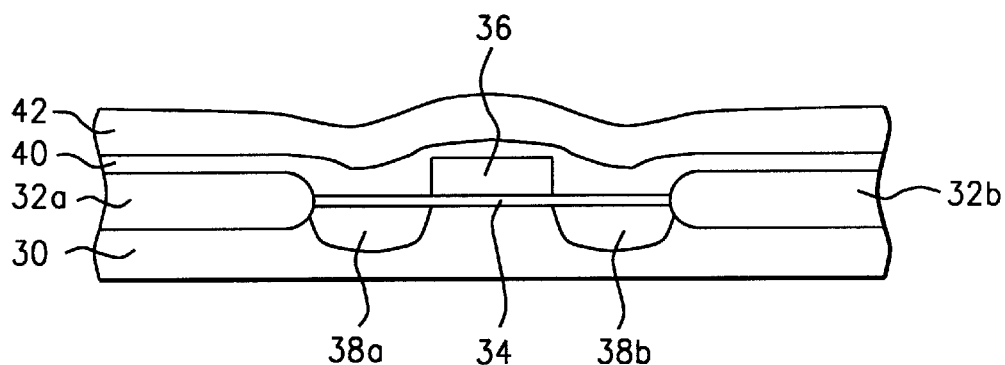

Referring now to FIG. 4 to FIG. 6, there is shown a series of schematic cross-sectional diagrams illustrating the results of forming, in accord with a more specific embodiment of the present invention which constitutes a second preferred embodiment of the present invention, a silicon oxide dielectric layer upon a semiconductor substrate employed within an integrated circuit microelectronics fabrication, with reduced ionic concentration and ionic mobility and attenuated hot electron reliability degradation. Shown in FIG. 4 is a schematic cross-sectional diagram of an integrated circuit microelectronics fabrication at an early stage in its fabrication in accord with the second preferred embodiment of the present invention.

Shown in FIG. 4 is a semiconductor substrate 30 having formed within and upon its surface a pair of isolation regions 32a and 32b which defines an active region of the semiconductor substrate 30. Although semiconductor substrates are known in the art of semiconductor integrated circuit microelectronics fabrication with either dopant polarity, several dopant concentrations and various crystallographic orientations, for the second preferred embodiment of the present invention, the semiconductor substrate 30 is preferably a (100) silicon semiconductor substrate having N- or P-type doping.

Similarly, although it is also known in the art of integrated circuit microelectronics fabrication that isolation regions may be formed within and upon semiconductor substrates while employing methods including but not limited to isolation region thermal growth methods and isolation region deposition/patterning methods, for the second preferred embodiment of the present invention the isolation regions 32a and 32b are preferably formed within and upon the semiconductor substrate 30 while employing an isolation thermal growth method at a temperature of from about 1000 to about 1200 degrees centigrade to form within and upon the semiconductor substrate 30 the pair of isolation regions 32a and 32b.

Shown also within FIG. 4 formed within and upon the active region of the semiconductor substrate 30 is a field effect transistor (FET) device which comprises a series of structures including: (1) a gate dielectric layer 34 formed upon the active region of the semiconductor substrate 30, the gate dielectric layer 34 having been formed and aligned thereupon; (2) a gate electrode 36; and (3) a pair of source/drain regions 38a and 38b formed within the active region of the semiconductor substrate 30 at areas not covered by the gate electrode 36. Each of the structures within the series of structures which comprises the field effect transistor (FET) may be formed employing methods and materials which are conventional in the art of field effect transistor (FET) fabrication.

For example, although it is known in the art of field effect transistor (FET) fabrication that gate dielectric layers may be formed through patterning, employing methods known in the art, of blanket gate dielectric layers formed upon active regions of silicon semiconductor substrates, for the second preferred embodiment of the present invention the gate dielectric layer 34 is formed by means of patterning a blanket silicon oxide dielectric layer formed employing thermal oxidation of silicon semiconductor substrate at an oxidation temperature of about 900 degrees centigrade to form the blanket silicon oxide gate oxide insulation layer to a thickness of about 150 angstroms.

Similarly, although it is known in the art of field effect transistor (FET) fabrication that gate electrodes may be formed through patterning, employing methods known in the art, of blanket gate electrode material layers, for the method of the second preferred embodiment of the present invention the gate electrode 36 is preferably formed through patterning, employing methods as are known in the art, of a blanket layer of a doped polysilicon or a polycide gate electrode material formed upon the blanket gate dielectric layer to a thickness of from about 1500 to about 4000 angstroms.

Referring now to FIG. 5, there is shown a schematic cross-sectional diagram illustrating the results of further processing, in accord with the second preferred embodiment of the present invention, of the integrated circuit microelectronics fabrication whose schematic cross-sectional diagram is shown in FIG. 4. Shown in FIG. 5 is an integrated circuit microelectronics fabrication otherwise equivalent to the integrated circuit microelectronics fabrication shown in FIG. 4, but where there has been formed over the integrated circuit microelectronics fabrication a blanket undoped silicon oxide glass dielectric layer 40.

With respect to the blanket undoped silicon oxide glass dielectric layer 40, the blanket undoped silicon oxide glass dielectric layer 40 has been formed analogous or equivalent to the blanket undoped silicon oxide glass dielectric layer 12 shown in FIG. 2 of the first preferred embodiment of the present invention.

Referring now to FIG. 6, there is shown a schematic cross-sectional diagram illustrating the results of further processing in accord with the second preferred embodiment of the present invention of the integrated circuit microelectronics fabrication whose schematic cross-sectional diagram is shown in FIG. 5. Shown in FIG. 6 is an integrated circuit microelectronics fabrication otherwise equivalent to the integrated circuit microelectronics fabrication shown in FIG. 5, but where there has been formed over the semiconductor substrate a blanket doped silicon containing glass dielectric layer 42.

With respect to the blanket doped silicon containing glass dielectric layer 42, the blanket doped silicon containing glass dielectric layer 42 is formed analogous or equivalent to the blanket doped silicon containing glass dielectric layer 14 shown in FIG. 3 of the first preferred embodiment of the present invention.

EXAMPLES

The benefits and advantages of the preferred embodiments of the present invention are understood within the context of the following experimental examples. The method of the first preferred embodiment of the present invention was employed to fabricate samples wherein there was compared the quality of the silicon oxide dielectric layer produced with that of several other silicon oxide dielectric layers produce employing different fabrication conditions. The principal variable was the relative amounts of ozone and TEOS employed to deposit silicon oxide dielectric layers employing the method of ozone assisted near-atmospheric pressure thermal chemical vapor deposition (APCVD). After deposition, the etch rates of the silicon oxide dielectric layers in hydrofluoric acid (HF) diluted 50:1 in $H_2O$ for 2 minutes was determined.

The experimental samples and etch rate results are given in Table I. The samples were fabricated in commercial reactor equipment for PECVD method of fabrication and for APCVD method of fabrication. The lowest etch rate is obtained for the silicon oxide dielectric layer with the highest density, which is known to be obtained by plasma enhanced chemical vapor deposition (PECVD) method of formation. The PECVD sample was fabricated employing the following conditions: (1) Source gas TEOS flow rate of 600 standard cubic centimeters per minute (sccm); (2) carrier gas flow rate of 1200 standard cubic centimeters per minute (sccm), (3) temperature 480 degrees centigrade; (4) pressure 10 torr; (5) power 600 watts. The experimental samples were fabricated employing the method of the present invention, at high ratios of $O_3$ to TEOS compared to the prior art method, which varied from 4:1 to 28:1. Two different TEOS flow rates were employed for each of the $O_3$:TEOS ratios. The etch rates and hence densities comparable to that of PECVD samples were obtained for the highest rate ratios at the lower TEOS flow rates:

TABLE I

| TEOS Flow Rate, sccm | $O_3$:R/TEOS Ratio | Silicon Oxide Etch Rate, A/minute |
|---|---|---|
| none; (PECVD) | — | 96 |
| 1200 | 4:1 | 116 |
| 1200 | 16:1 | 101 |
| 1200 | 28:1 | 104 |
| 900 | 4:1 | 110 |
| 900 | 16:1 | 101 |
| 900 | 28:1 | 99 |

Experimental samples of field effect transistor (FET) devices were fabricated employing conventional methods of FET fabrication as are known in the art up to the point of deposition of an overall passivation layer. The method of the second preferred embodiment of the present invention was employed to deposit a blanket silicon oxide glass dielectric layer over and upon the FET devices in accord with the method of the present invention, and variations of the method were employed to produce experimental samples for comparison. After fabrication, samples were measured for electrical parameters and the results are shown in Table II.

TABLE II

| TEOS Flow Rate (sccm) | $O_3$:TEOS ratio | $I_{sub3}$, uA +/− | Failure time $t_f$, khrs |
|---|---|---|---|
| SACVD | SACVD | 2.04 +/− 0.07 | 472 |
| 1200 | 4:1 | 3.35 +/− 0.24 | 6 |
| 1200 | 16:1 | 3.16 +/− 0.35 | 43 |
| 1200 | 28:1 | 2.24 +/− 0.28 | 218 |
| 900 | 4:1 | 2.82 +/− 0.44 | 37 |
| 900 | 16:1 | 2.16 +/− 0.18 | 139 |
| 900 | 28:1 | 2.07 +/− 0.09 | 479 |

The results in Table II show that the FET device samples fabricated in accord with the method of the present invention at the highest ratios of $O_3$ to TEOS and the lower TEOS flow rate show the lowest substrate leakage current $I_{sub3}$ and the longest projected time to hot carrier failure $t_f$, equivalent to samples with silicon oxide dielectric passivation layers formed by sub-atmospheric pressure thermal chemical vapor deposition (SACVD) methods, which are known in the art to provide excellent passivation for FET devices.

As is understood by a person skilled in the art, the preferred embodiments of the present invention are illustrative of the present invention rather than limiting of the present invention. Revisions and modifications may be made to methods, materials, structures and dimensions through which are formed microelectronics fabrications in accord with the first preferred embodiment of the present invention and integrated circuit microelectronics fabrications in accord with the preferred second embodiment of the present invention while still remaining within the spirit and scope of the present invention.

What is claimed is:

1. A method for forming a silicon oxide layer comprising:
   providing a substrate;
   forming over the substrate a blanket undoped silicon oxide glass dielectric layer employing ozone assisted near-atmospheric pressure thermal chemical vapor deposition (APCVD) from tetra-ethyl-ortho-silicate (TEOS) vapor at an ozone; TEOS flow rate ratio of greater than about 28:1 at a TEOS gas flow rate of from about 900 to about 1200 standard cubic centimeters per minute (sccm).

2. The method of claim 1 further comprising:

forming upon the undoped layer and over the substrate a blanket doped silicon containing glass dielectric layer.

3. The method of claim 1 wherein the blanket undoped silicon oxide glass dielectric layer serves as a barrier layer for diffusion of mobile species from the blanket doped silicon oxide layer.

4. The method of claim 1 here the substrate is employed within a microelectronics fabrication is selected from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

5. The method of claim 1 wherein the blanket doped silicon containing glass dielectric layer is doped with boron and phosphorus and is formed employing ozone assisted near-atmospheric pressure thermal chemical vapor deposition (APCVD) from tetra-ethyl-ortho-silicate (TEOS) vapor.

6. A method for forming upon a semiconductor substrate employed within an integrated circuit microelectronics fabrication a dielectric layer comprising:

providing a semiconductor substrate;

forming within and upon the semiconductor substrate structures comprising field effect transistor (FET) devices;

forming over and upon the substrate and devices a blanket undoped silicon oxide dielectric layer employing ozone assisted near-atmospheric pressure thermal chemical vapor deposition (APCVD) from tetra-ethyl-ortho-silicate (TEOS) vapor employing a ratio of ozone ($O_3$):TEOS gas flow rates of from about 4000 to about 5000 standard cubic centimeters per minute (sccm) at a TEOS gas flow rate of from about 900 to about 1200 standard cubic centimeters per minute (sccm) to provide an $O_3$:TEOS ratio of greater than about 28:1; and forming over the semiconductor substrate a blanket doped silicon containing glass dielectric layer employing ozone assisted near-atmospheric pressure thermal chemical vapor deposition (APCVD) from tetra-ethyl-ortho-silicate (TEOS) vapor.

7. The method of claim 6 wherein the semiconductor substrate is a silicon semiconductor substrate of (100) orientation of either N- or P-type doping.

8. The method of claim 6 wherein the blanket undoped silicon oxide dielectric layer is formed with enhanced density and reduced mobile species, ionic concentration and ionic mobility.

9. The method of claim 8 wherein the blanket undoped silicon oxide dielectric layer with reduced mobile species, ionic concentration and ionic mobility serves as a barrier to mobile species from the blanket doped silicon containing glass dielectric layer or from other dielectric layers, thus attenuating hot carrier degradation of field effect transistor (FET) device reliability.

10. The method of claim 6 wherein the blanket doped silicon containing glass dielectric layer is doped with boron and phosphorus and is formed employing ozone assisted near-atmospheric pressure thermal chemical vapor deposition (APCVD).

* * * * *